United States Patent
Michaelson

(10) Patent No.: US 6,499,118 B1
(45) Date of Patent: Dec. 24, 2002

(54) REDUNDANCY ANALYSIS METHOD AND APPARATUS FOR ATE

(75) Inventor: Steven A. Michaelson, Moorpark, CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/574,689

(22) Filed: May 17, 2000

(51) Int. Cl.⁷ .............................................. G11C 29/00
(52) U.S. Cl. ...................... 714/711; 714/721; 714/710; 714/718
(58) Field of Search .................................. 714/704, 711, 714/41, 721, 710, 718; 365/201; 324/765; 438/4; 700/121

(56) References Cited

U.S. PATENT DOCUMENTS

| | | | |
|---|---|---|---|
| 5,235,271 A | * 8/1993 | Kira ............................ | 324/765 |
| 5,522,038 A | * 5/1996 | Lindsay et al. ............... | 714/41 |
| 5,588,115 A | * 12/1996 | Augarten .................... | 714/29 |
| 5,754,556 A | 5/1998 | Ramseyer et al. ........... | 714/711 |
| 5,764,650 A | 6/1998 | Debenham .................. | 714/704 |
| 5,795,797 A | * 8/1998 | Chester et al. ................. | 438/4 |
| 5,862,088 A | 1/1999 | Takemoto et al. .......... | 365/201 |
| 6,288,955 B1 | * 9/2001 | Shibano et al. ............. | 365/201 |
| 6,349,240 B2 | * 2/2002 | Ogawa et al. .............. | 700/121 |

FOREIGN PATENT DOCUMENTS

WO   WO 98/06103   2/1998   ........... G11C/29/00

* cited by examiner

Primary Examiner—David Ton
(74) Attorney, Agent, or Firm—Lance Kreisman

(57) ABSTRACT

A method of determining a redundancy solution for a semiconductor memory under test (DUT) having redundant rows and columns is disclosed. The method includes the steps of first testing the DUT in a first environment with a first tester to generate a first fail data set. The first fail data set is then transferred to a second tester where the DUT is test in a second environment to generate a second fail data set. The first and second failure data sets are then merged to create a merged fail data set. A highly optimized redundancy solution is then determined based on the merged fail data set.

4 Claims, 5 Drawing Sheets

REDUNDANCY ANALYSIS METHOD AND APPARATUS FOR ATE

FIELD OF THE INVENTION

The invention relates generally to automatic test equipment and more particularly a method and apparatus for carrying out an optimal redundancy analysis on a multi-tester system.

BACKGROUND OF THE INVENTION

Semiconductor memory manufacturers employ a variety of processes to fabricate memory devices or "chips." Each process attempts to optimize the requirements for high yields and high throughput in order for the manufacturer to remain competitive.

One of the more critical processes involves automated testing of each chip at the wafer level with automatic test equipment. The testing, among other things, generally involves reading data to and writing data from each chip according to pre-programmed test patterns, and detecting the addresses of failed memory cells.

To optimize yields in the test process, memory chips typically include spare rows and columns that can be implemented to replace faulty rows and/or columns detected in the device by the test equipment. Since only a limited number of spares are available to repair the chip, the tester generally determines a "solution", or arrangement where a minimum number of spares can repair a maximum number of failed cells in order to bring the device within acceptable tolerances. One significant method for generating such a solution is found in U.S. Pat. No. 5,795,797, hereby expressly incorporated by reference herein, and assigned to the assignee of the present invention.

Recently, chip makers have recognized the need to test wafers in different environments, such as under high and low temperatures. This is because those skilled in the art have found that failures may occur at some addresses in a particular portion of the memory array, while different failures may occur in the same portion of the array at low temperature.

Conventionally, testing wafers at different temperatures involves employing two separate testers—one for high temperature testing, and the other for low temperature testing. The wafer is first tested at high temperature, and the failure data processed to determine a high temperature solution for the available spare rows and/or columns. FIG. 2 illustrates the high temperature solution whereby spare columns C1, C2 and C3, and spare rows R1 and R2 repair the memory array 30.

The solution, represented electronically by far less data than the first fail data set, is then transferred to the low temperature tester, where the wafer is re-tested. The fails detected from the low temperature tester are then analyzed and a solution is determined with respect to any remaining spares not already allocated by the first solution. As further shown in FIG. 2 with the same memory array 30, two additional fails in the same column were detected at low temperature. However, because all of the column spares are allocated, with only one spare row remaining, the fail at 35 cannot be repaired. As a result, the chip would most likely fail testing, thereby contributing to a decrease in the yield of acceptable devices on the wafer.

While the conventional multi-tester method of carrying out a redundancy analysis is beneficial for its intended applications, it does not always provide the optimal solution. This is most likely due to the undesirability of transferring the large amount of bit-image data representing the high temperature fails to the low temperature tester. For conventional testers, transferring such large amounts of data to a second tester takes too much time, thereby reducing throughput.

What is needed and heretofore unavailable is a method and apparatus for carrying out a highly optimized redundancy analysis that maximizes yields while simultaneously maintaining high throughput through a multi-tester testing system. The method and apparatus of the present invention satisfies these needs.

SUMMARY OF THE INVENTION

The redundancy analysis method of the present invention provides a highly optimized way of determining a multi-tester redundancy solution without sacrificing wafer throughput. This minimizes costs associated with the test process to help a semiconductor manufacturer remain competitive.

To realize the foregoing advantages, the invention in one form comprises a method of determining a redundancy solution for a semiconductor device under test (DUT) having redundant rows and columns. The method includes the steps of first testing the DUT in a first environment with a first tester to generate a first fail data set. The first fail data set is then transferred to a second tester where the DUT is test in a second environment to generate a second fail data set. The first and second failure data sets are then merged to create a merged fail data set. A highly optimized redundancy solution is then determined based on the merged fail data set.

In another form, the invention is implemented in a process for manufacturing a semiconductor memory (DUT) organized into rows and columns of memory cells. The invention comprises a method of replacing faulty memory cells with redundant rows and columns. The method includes the steps of first selecting rows or columns to replace with redundant elements according to the steps of first testing the DUT in a first environment with a first tester to generate a first fail data set. The first fail data set is then transferred to a second tester where the DUT is test in a second environment to generate a second fail data set. The first and second failure data sets are then merged to create a merged fail data set. A highly optimized redundancy solution is then determined based on the merged fail data set. After the solution is determined, the redundant rows or columns selected in the selecting step are allocated to replace the selected rows and/or columns.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

Figure 1:
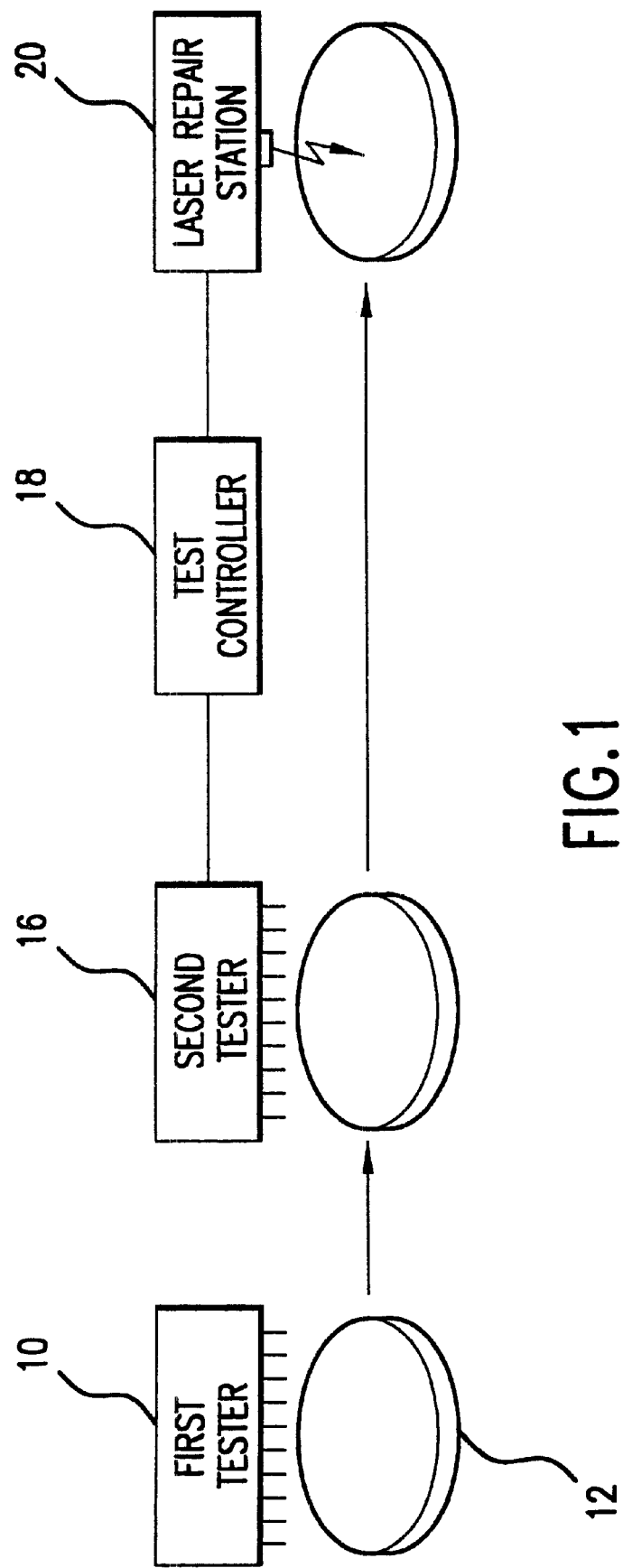
FIG. 1 is a block diagram of a multi-tester test system according to one form of the present invention.

Referring now to FIG. 1, a multi-tester test system in accordance with the present invention includes respective first and second semiconductor testers 10 and 16 for testing a semiconductor wafer 12 at respective high and low temperatures. As is well known in the art, the wafer comprises a plurality of formed memory develops that, while under test, are known as devices-under-test, or DUT's. The testers preferably comprise Marlin J996 memory testers manufactured by Teradyne Inc., in Agoura Hills, Calif., and include respective redundancy analyzers (not shown) for developing repair solutions. A test system controller 18 coordinates data transmission from the second tester 16 to a laser repair station 20. The laser repair station replaces defective rows and/or columns in each device on the wafer in accordance with the repair solution developed by the redundancy analyzers of the second tester. The solution is developed by a highly optimized redundancy analysis method described below.

Figures 3A, 3B, 3C:
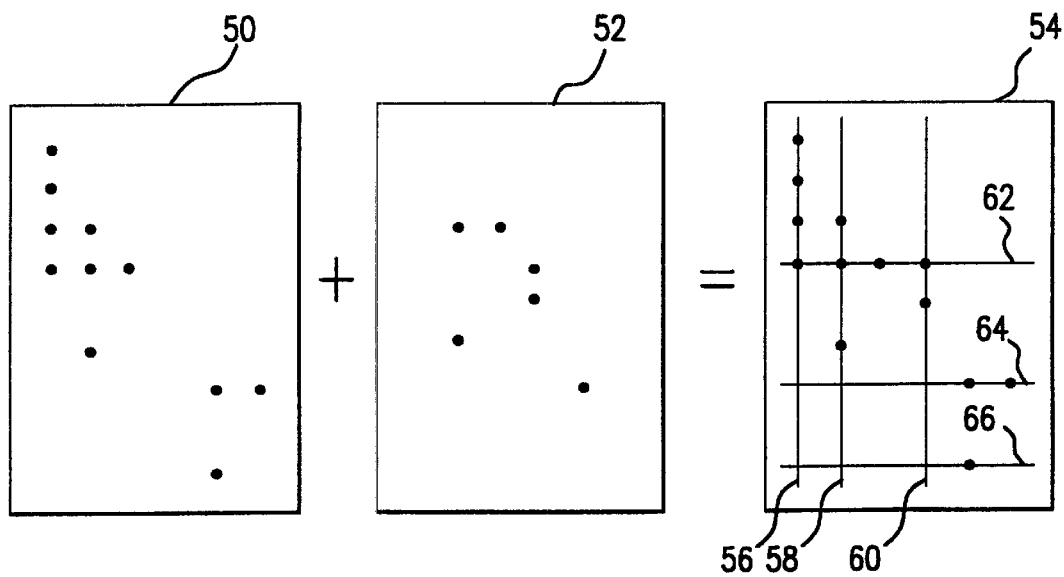
FIGS. 3A–3C are diagrams illustrating one form of the redundancy analysis method of the present invention.

Referring now to FIGS. 3A–3C and 4, the redundancy analysis method of the present invention generally involves first testing the wafer on the first tester in a first environment, such as high temperature, at step 100. The testing may include any of a number of test schemes for memory devices that are well known to those skilled in the art. In response to the testing, a first set of fail data is generated in the first tester, at step 102. FIG. 3A illustrates a first failure data set representing the locations of failed memory cells in a portion of a memory array 50.

Figure 2A:
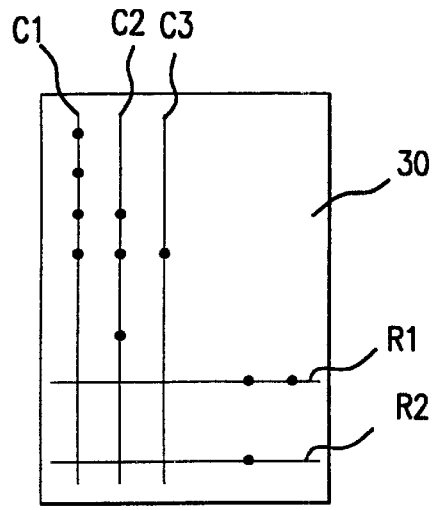
FIGS. 2A and 2B are diagrams illustrating the conventional redundancy analysis method for multi-tester systems.
Figure 2B:
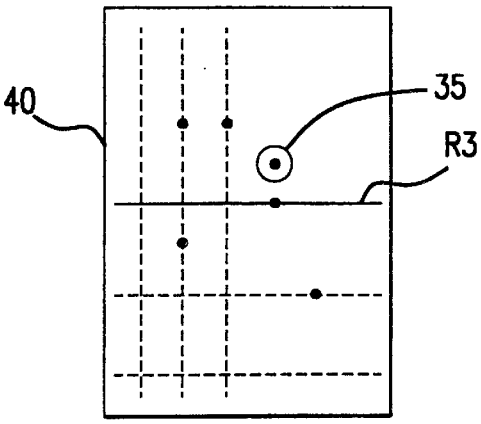
Figure 4:
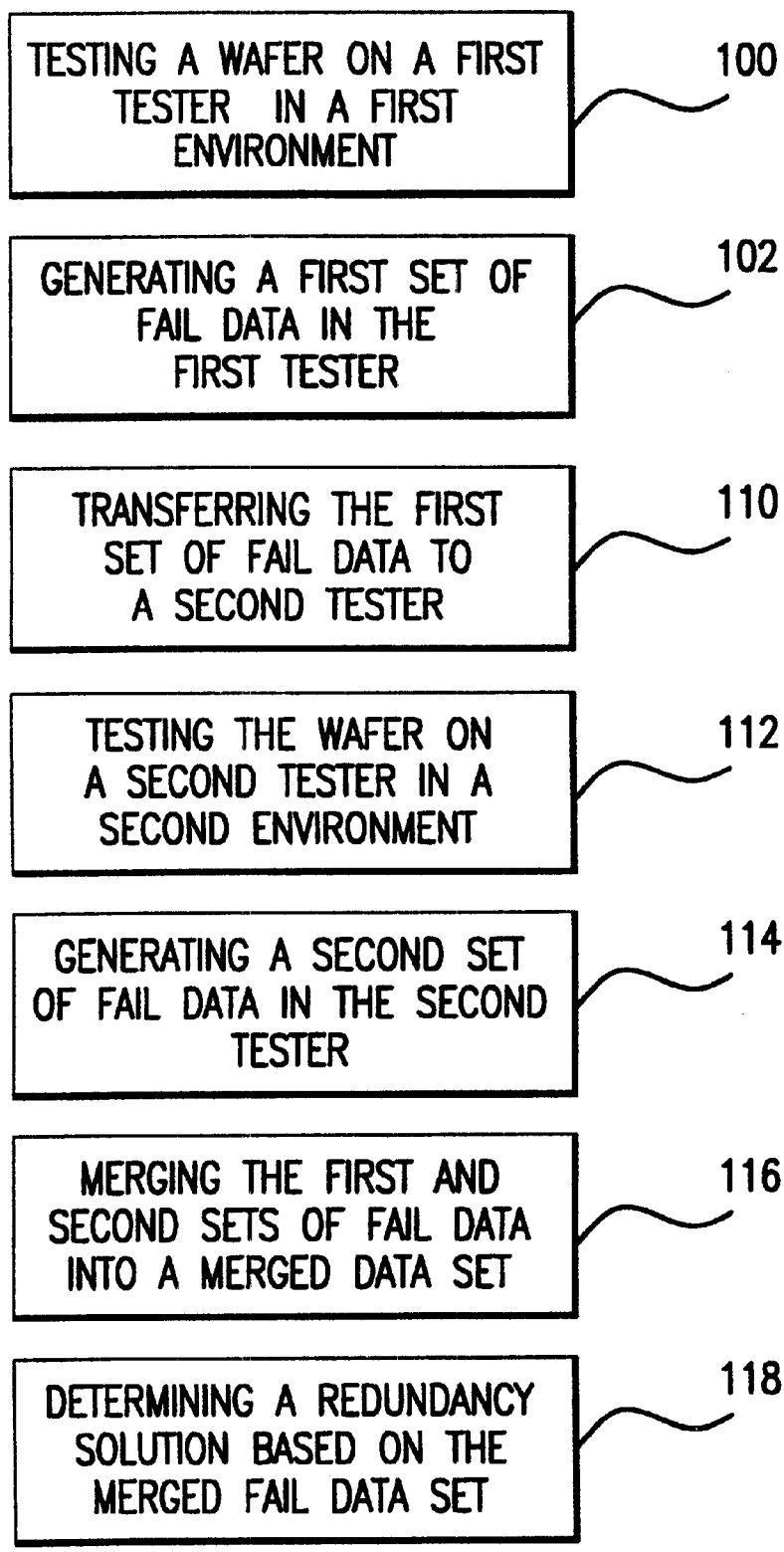
FIG. 4 is a flowchart specifying steps used in the method illustrated in FIG. 3.

Further referring to FIG. 4, the method continues by transferring the first set of fail data as a data file to the second tester 16, at step 110, then testing the wafer 12 on the second tester in a second environment, such as low temperature, at step 112. A second set of fail data is generated in the second tester, at step 114, shown graphically in FIG. 3B. It should be pointed out that the first and second failure data sets of FIGS. 3A and 3B match those of FIGS. 2A and 2B to illustrate the yield advantages of the present invention.

Figure 5:
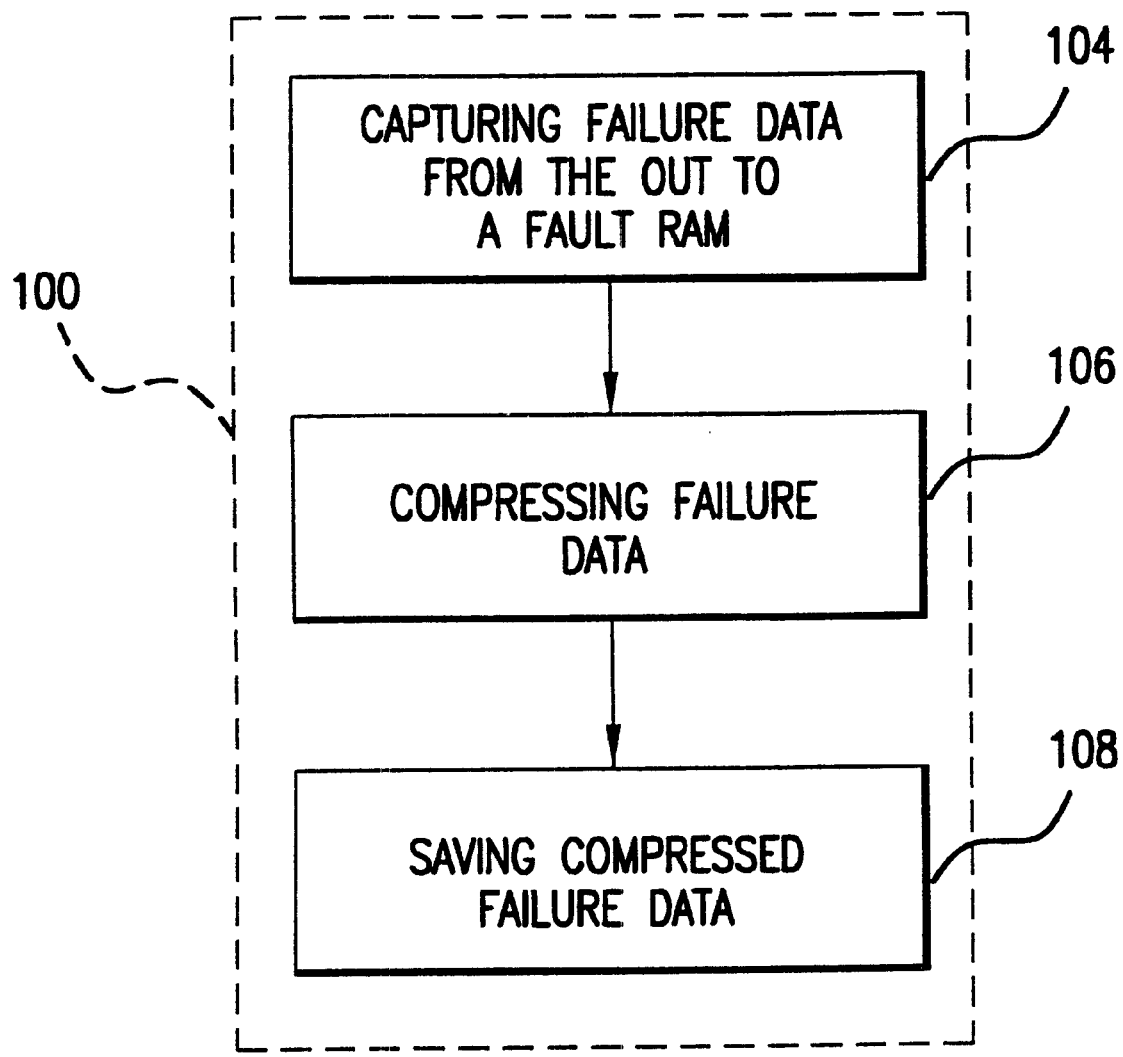
FIG. 5 is a flowchart of more specific steps relating to the testing steps of FIG. 4.

With reference to FIG. 5, to minimize the fail data file size and the corresponding transfer time of the first failure data set transfer, thereby optimizing tester throughput, the generating step 102 involves the steps of first capturing failure data from the DUT to a fault RAM, at step 104. The fault RAM comprises memory within the redundancy analyzers (not shown). Once the failure data is captured, the data is compressed, at step 106 by any suitable compression algorithm or compressor hardware such as that disclosed in U.S. Pat. No. 5,588,115, assigned to the assignee of the present invention and expressly incorporated herein by reference. Consistent with the cited patent, the fault RAM generally stores fault addresses identifying locations of faults or fails in the DUT. This greatly reduces the amount of data for transfer. Additionally, the compression method may involve steps described more fully below, and illustrated in FIG. 6. Once the data is compressed, it is saved for the subsequent transfer to the second tester, at step 110.

After the second failure data set is generated by the second tester 16 in step 114, the first and second data sets are merged into a merged fail data set, at step 118, shown graphically in FIG. 3C. Once the merged data file is established, the second tester's redundancy analyzers (not shown) determine an optimal redundancy solution based on the merged fail data set. The redundancy solution for the merged data may be determined according to the steps disclosed in U.S. Pat. No. 5,795,797, previously incorporated by reference.

Figure 6:
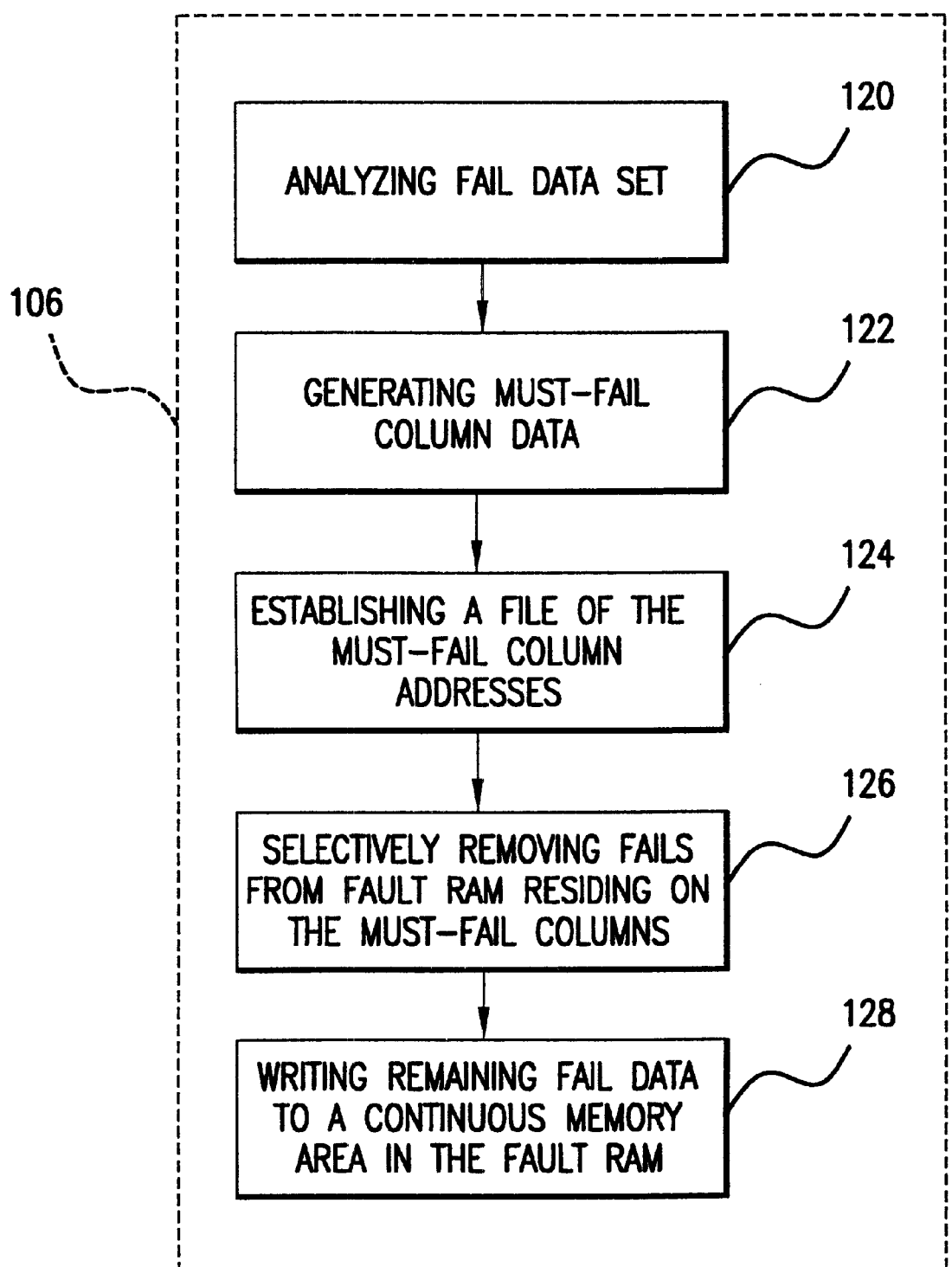
FIG. 6 is a flowchart of more specific steps relating to the compressing step of FIG. 5.

As noted above, an alternative compression method reduces the amount of data even further than the previously described method and involves utilizing a derivative of a must-fail scheme more fully described in U.S. Pat. No. 5,795,797, previously incorporated by reference. With reference to FIG. 6, the compression method generally includes the steps of first analyzing the fail data set, at step 120, then generating must-fail column data, at step 122. A file of the must-fail column addresses is then established, at step 124. Fail data in the fault RAM that resides in the must-fail column addresses is then selectively removed, at step 126, followed by a mass writing of the remaining fail data to a contiguous memory area in the fault RAM. This compression scheme minimizes the amount of fail data for transfer to the second tester, thereby maximizing the tester system throughput.

Those skilled in the art will appreciate the many benefits and advantages afforded by the present invention. Of particular importance is the merging of fail data from the respective first and second fail data sets to improve wafer yields. While the conventional redundancy analysis method described previously would have failed a DUT exhibiting respective first and second data sets shown in FIGS. 2 and 3, by virtue of the fact that the present invention waits to determine a solution after the first and second data sets are merged, the redundancy solution successfully repairs the DUT. As a direct result, wafer yields are substantially increased upwards of 3% or more.

While the invention has been particularly shown and described with reference to the preferred embodiments thereof, it will be understood by those skilled in the art that various changes in form and detail may be made therein without departing from the spirit and scope of the invention. For example, while the present invention has been described in detail for use with a specific compression scheme, it should be understood that many different compression schemes could be implemented to speed the transfer of fail data from the first tester to the second.

Moreover, while the alternative compression method is described in the context of memory cell columns, the process is applicable to memory cell rows as well without affecting the present invention.

What is claimed is:

1. A method of determining a redundancy solution for a semiconductor memory having redundant rows and columns, said method including the steps of:

testing said chip in a first environment with a first tester to generate a first fail data set;

transferring said first fail data set to a second tester;

testing said chip in a second environment with said second tester to generate a second fail data set;

merging said first and second fail data sets to create a merged fail data set; and determining a redundancy solution based on said merged fail data set.

2. A method of determining a redundancy solution for a semiconductor memory according to claim 1 wherein both of said steps of testing include the steps of:

capturing failure data from the DUT to a fault RAM;

compressing said failure data; and saving said compressed failure data.

3. A method of determining a redundancy solution for a semiconductor memory according to claim 2 wherein said step of compressing includes the steps of:

analyzing said fail data set;
generating must-fail column data;
establishing a file o the must-fail column addresses;
selectively removing fails residing in the must-fail columns from said fault RAM;
writing the remaining fail data to a contiguous memory portion in said fault RAM.

4. In a process for manufacturing a semiconductor memory organized into rows and columns of memory cells, a method of replacing faulty memory cells with redundant rows and columns, the method comprising the steps of:

selecting rows or columns to replace with redundant elements according to the steps of:
testing said chip in a first environment with a first tester to generate a first fail data set;
transferring said first fail data set to a second tester;
testing said chip in a second environment with said second tester to generate a second fail data set;
merging said first and second fail data sets to create a merged fail data set; and
determining a redundancy solution based on said merged fail data set; and
allocating said redundant rows or columns selected in said selecting step to replace the selected row or column.

* * * * *